(12) United States Patent
Wang et al.

(10) Patent No.: US 10,204,997 B2
(45) Date of Patent: Feb. 12, 2019

(54) THIN FILM TRANSISTOR, DISPLAY SUBSTRATE AND DISPLAY PANEL HAVING THE SAME, AND FABRICATING METHOD THEREOF

(71) Applicant: BOE TECHNOLOGY GROUP CO., LTD., Beijing (CN)

(72) Inventors: Ke Wang, Beijing (CN); Ce Ning, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/560,724

(22) PCT Filed: Sep. 21, 2016

(86) PCT No.: PCT/CN2016/099573
§ 371 (c)(1),
(2) Date: Sep. 22, 2017

(87) PCT Pub. No.: WO2018/053707
PCT Pub. Date: Mar. 29, 2018

(65) Prior Publication Data
US 2018/0254328 A1 Sep. 6, 2018

(51) Int. Cl.
*H01L 27/12* (2006.01)
*H01L 29/45* (2006.01)
*H01L 21/02* (2006.01)
*C23C 14/35* (2006.01)
(Continued)

(52) U.S. Cl.
CPC ............. *H01L 29/45* (2013.01); *C23C 14/35* (2013.01); *G02F 1/1343* (2013.01); *G03F 5/16* (2013.01);
(Continued)

(58) Field of Classification Search
None
See application file for complete search history.

(56) References Cited

U.S. PATENT DOCUMENTS 5,219,680 A * 6/1993 Fauteux ............... H01M 4/044
429/231.3
5,843,393 A * 12/1998 Denton, III ............ D01F 9/12
423/447.4
(Continued)

FOREIGN PATENT DOCUMENTS

| CN | 102269900 A | 12/2011 |
| KR | 100850495 B1 | 8/2008 |
| KR | 20150070839 A | 6/2015 |

OTHER PUBLICATIONS

International Search Report & Written Opinion dated Jun. 28, 2017 regarding PCT/CN2016/099573; English translation attached.

*Primary Examiner* — Michael Lebentritt
(74) *Attorney, Agent, or Firm* — Intellectual Valley Law, P.C.

(57) ABSTRACT

The present application discloses a thin film transistor, a display substrate and display panel having the same, and a fabricating method thereof. The thin film transistor includes a base substrate; an active layer on the base substrate having a channel region, a first electrode contact region, and a second electrode contact region; and a first electrode on a side of the first electrode contact region distal to the base substrate; and a second electrode on a side of the second electrode contact region distal to the base substrate; the first electrode and the second electrode being made of an amorphous carbon material.

20 Claims, 4 Drawing Sheets

(51) Int. Cl.
  *H01L 21/027* (2006.01)
  *H01L 29/66* (2006.01)
  *H01L 29/24* (2006.01)
  *H01L 29/786* (2006.01)
  *G03F 5/16* (2006.01)
  *H01L 21/443* (2006.01)
  *G02F 1/1343* (2006.01)
  *G02F 1/13363* (2006.01)
  *H01L 21/77* (2017.01)

(52) U.S. Cl.
  CPC .... *H01L 21/0274* (2013.01); *H01L 21/02565* (2013.01); *H01L 21/02631* (2013.01); *H01L 21/443* (2013.01); *H01L 27/127* (2013.01); *H01L 27/1225* (2013.01); *H01L 27/1288* (2013.01); *H01L 29/24* (2013.01); *H01L 29/66969* (2013.01); *H01L 29/7869* (2013.01); *H01L 29/78633* (2013.01); *G02F 1/13363* (2013.01); *H01L 21/77* (2013.01)

(56) References Cited

U.S. PATENT DOCUMENTS

| | | | |
|---|---|---|---|
| 6,329,672 B1 * | 12/2001 | Lyu | H01L 27/12 257/347 |
| 7,291,970 B2 * | 11/2007 | Kuwabara | H01L 27/3246 313/504 |
| 7,307,338 B1 * | 12/2007 | Mandell | H01L 25/16 257/40 |
| 7,335,917 B2 * | 2/2008 | Koo | H01L 21/02422 257/368 |
| 7,476,901 B2 * | 1/2009 | Oh | H01L 27/12 257/59 |
| 8,299,470 B2 * | 10/2012 | Kang | H01L 27/1288 257/347 |
| 2004/0159835 A1 * | 8/2004 | Krieger | B82Y 10/00 257/40 |
| 2010/0012509 A1 * | 1/2010 | Brenneman | A61B 5/14532 205/777.5 |
| 2011/0299004 A1 | 12/2011 | Liu et al. | |
| 2012/0094176 A1 * | 4/2012 | Neumann | H01M 4/36 429/211 |
| 2014/0042390 A1 * | 2/2014 | Gruner | H01M 4/364 257/14 |
| 2014/0204305 A1 * | 7/2014 | Tseng | H01L 29/66969 349/46 |
| 2014/0374740 A1 * | 12/2014 | Lou | H01L 27/1225 257/43 |
| 2015/0179743 A1 | 6/2015 | Niyogi | |
| 2016/0111180 A1 | 4/2016 | Joo et al. | |
| 2017/0294456 A1 * | 10/2017 | Lee | H01L 21/02164 |
| 2017/0349442 A1 * | 12/2017 | Feaver | H01G 11/34 |
| 2018/0062155 A1 * | 3/2018 | Mitchell | H01M 4/0457 |

* cited by examiner

THIN FILM TRANSISTOR, DISPLAY SUBSTRATE AND DISPLAY PANEL HAVING THE SAME, AND FABRICATING METHOD THEREOF

CROSS-REFERENCE TO RELATED APPLICATION

This application is a national stage application under 35 U.S.C. § 371 of International Application No. PCT/CN2016/099573, filed Sep. 21, 2016, the contents of which are incorporated by reference in the entirety.

TECHNICAL FIELD

The present invention relates to display technology, more particularly, to a thin film transistor, a display substrate and display panel having the same, and a fabricating method thereof.

BACKGROUND

Display devices such as liquid crystal display (LCD) and organic light-emitting diode (OLED) have been widely used. LCD and OLED display devices use thin film transistor (TFT) to control pixels in the display panel. Examples of TFT include amorphous silicon TFT, polycrystalline silicone TFT, single crystal silicon TFT, and metal oxide TFT.

SUMMARY

In one aspect, the present invention provides a thin film transistor comprising a base substrate; an active layer on the base substrate comprising a channel region, a first electrode contact region, and a second electrode contact region; and a first electrode on a side of the first electrode contact region distal to the base substrate; and a second electrode on a side of the second electrode contact region distal to the base substrate; the first electrode and the second electrode being made of an amorphous carbon material.

Optionally, the thin film transistor further comprises a gate insulating layer on a side of the channel region distal to the base substrate; and a gate electrode layer on a side of the gate insulating layer distal to the channel region.

Optionally, the thin film transistor further comprises a buffer layer on a side of the active layer proximal to the base substrate; and a light shielding layer on a side of the buffer layer distal to the channel region in an area corresponding to the channel region for shielding the channel region from light.

Optionally, the amorphous carbon material comprises a hydrogenated amorphous carbon material.

Optionally, the active layer is made of a material comprising $M1O_aN_b$, wherein M1 is a single metal or a combination of metals, a>0, and b≥0.

Optionally, the active layer is made of indium gallium zinc oxide.

Optionally, the thin film transistor further comprises a passivation layer on a side of the gate electrode layer distal to the base substrate; and a pixel electrode layer on a side of the passivation layer distal to the base substrate.

Optionally, the active layer has a thickness in the range of approximately 40 nm to approximately 50 nm.

Optionally, the first electrode and the second electrode have a thickness in the range of approximately 200 nm to approximately 500 nm.

In another aspect, the present invention provides a method of fabricating a thin film transistor comprising forming an active layer on a base substrate having a channel region, a first electrode contact region, and a second electrode contact region; forming a first electrode on a side of the first electrode contact region distal to the base substrate; and forming a second electrode on a side of the second electrode contact region distal to the base substrate; the first electrode and the second electrode being made of an amorphous carbon material.

Optionally, the step of forming the active layer, the step of forming the first electrode, and the step of forming the second electrode comprise sequentially forming a semiconductor material layer and an amorphous carbon material layer on the base substrate; patterning the semiconductor material layer to form the active layer; and patterning the amorphous carbon material layer to form the first electrode and the second electrode.

Optionally, the active layer, the first electrode, and the second electrode are formed by patterning the semiconductor material layer and the amorphous carbon material layer using a single mask plate.

Optionally, the semiconductor material layer and the amorphous carbon material layer are formed by depositing a semiconductor material on the base substrate to form a semiconductor material layer; and depositing an amorphous carbon material on the semiconductor material layer to form the amorphous carbon material layer on a side of the semiconductor material layer distal to the base substrate.

Optionally, the semiconductor material comprises indium gallium tin oxide, and is deposited on the base substrate using a vapor deposition process in an atmosphere comprising oxygen in a range of approximately 15% to approximately 30% by volume.

Optionally, the amorphous carbon material is deposited by a magnetron sputtering process.

Optionally, the step of forming the active layer, the first electrode, and the second electrode using a single mask plate comprises depositing a semiconductor material on the base substrate to form the semiconductor material layer, depositing an amorphous carbon material on the semiconductor material layer to form the amorphous carbon material layer on a side of the semiconductor material layer distal to the base substrate; forming a photoresist layer on a side of the amorphous carbon material layer distal to the semiconductor material layer; exposing the photoresist layer with a half-tone mask plate or a gray-tone mask plate, and developing the exposed photoresist layer to obtain a photoresist pattern having a first section corresponding to the channel region, a second section corresponding to the first electrode contact region and the second electrode contact region, and a third section outside of the first section and the second section, the first section being partially exposed, the second section being substantially unexposed, the third section being fully exposed, and the photoresist material being removed in the third section; removing the semiconductor material layer and the amorphous carbon material layer in the third section, thereby forming the active layer; removing the photoresist layer in the first section while maintaining the photoresist layer in the second section, thereby exposing the amorphous carbon material layer in the first section; and removing the amorphous carbon material layer in the first section, thereby forming the first electrode and the second electrode.

Optionally, the amorphous carbon material layer in the first section and the third section is removed by dry etching using oxygen.

Optionally, the photoresist layer in the first section is removed by ashing.

Optionally, subsequent to the step of forming the active layer, the first electrode, and the second electrode, the method further comprises annealing the active layer at an annealing temperature in the range of approximately 230 degrees to approximately 400 degrees.

Optionally, the active layer being made of a semiconductor material comprising $M1O_aN_b$, wherein M1 is a single metal or a combination of metals, a>0, and b≥0.

In another aspect, the present invention provides a display apparatus comprising a thin film transistor described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Conventional TFTs typically use metal material for making various electrodes such as a gate electrode, a source electrode and a drain electrode. Because metal materials are non-transparent, the aperture ratio of conventional TFTs is relatively low. Further convention TFTs typically are fabricated using multiple patterning steps. For example, an oxide TFT is typically fabricated in at least 8 to 9 patterning steps. The manufacturing costs of a display panel having a conventional TFT remains relatively high due to these reasons.

Accordingly, the present disclosure provides a novel thin film transistor, a display substrate and display panel having the same, and a fabricating method thereof that substantially obviate one or more of the problems due to limitations and disadvantages of the related art. In one aspect, the present disclosure provides a thin film transistor. In some embodiments, the thin film transistor includes a base substrate; an active layer on the base substrate having a channel region, a first electrode contact region, and a second electrode contact region; a first electrode on a side of the first electrode contact region distal to the base substrate; and a second electrode on a side of the second electrode contact region distal to the base substrate; the first electrode and the second electrode being made of an amorphous carbon material. Optionally, the active layer being made of a material including $M1O_aN_b$, wherein M1 is a single metal or a combination of metals, a>0, and b≥0.

In another aspect, the present disclosure provides a method of fabricating a thin film transistor. In some embodiments, the method includes forming an active layer on a base substrate having a channel region, a first electrode contact region, and a second electrode contact region; forming a first electrode on a side of the first electrode contact region distal to the base substrate; and forming a second electrode on a side of the second electrode contact region distal to the base substrate; the first electrode and the second electrode being made of an amorphous carbon material. Optionally, the active layer being made of a material including $M1O_aN_b$, wherein M1 is a single metal or a combination of metals, a>0, and b≥0.

Figure 1:
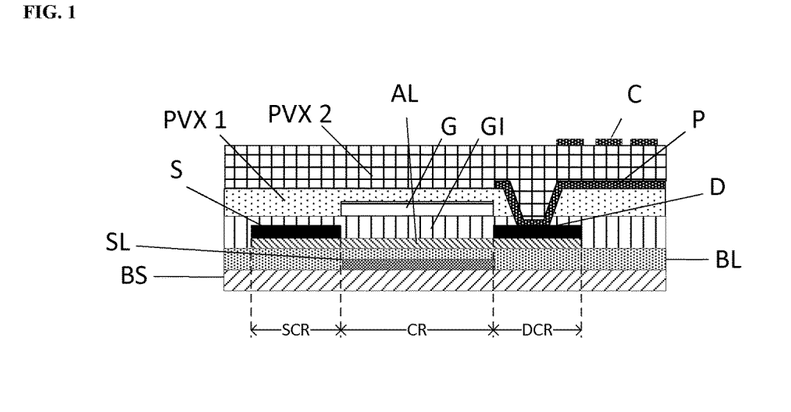
FIG. 1 is a diagram illustrating the structure of a thin film transistor in some embodiments.

FIG. 1 is a diagram illustrating the structure of a thin film transistor in some embodiments. Referring to FIG. 1, the thin film transistor in the embodiment includes a base substrate BS, an active layer AL on the base substrate BS, and a first electrode S and a second electrode D. The active layer AL includes a channel region CR, a first electrode contact region SCR, and a second electrode contact region DCR. Optionally, the channel region CR is between the first electrode contact region SCR and the second electrode contact region DCR (as shown in FIG. 1). The first electrode S is on a side of the first electrode contact region SCR distal to the base substrate BS. The second electrode D is on a side of the second electrode contact region DCR distal to the base substrate BS. In particular, the first electrode S and the second electrode D are made of an amorphous carbon material.

As used herein, the term "amorphous carbon" refer to a carbonaceous material composed of a mixture of "$sp^2$" and "$sp^3$" bonded carbon. "$Sp^2$" bonded carbon refers to double bonded carbon commonly associated with graphite. "$Sp^3$" bonded carbon refers to single bonded carbon. Amorphous carbon does not possess a highly ordered crystalline structure, but generally takes the form of small nanometer sized (or larger) islands of graphite dispersed within an amorphous matrix of $sp^3$ bonded carbon. Optionally, the amorphous carbon has a graphite-like amorphous carbon microstructure, a diamond-like amorphous carbon microstructure, a polymer-like amorphous carbon microstructure, or any combination thereof. Further, the term amorphous carbon may be used without limitation as to the percentage of the material having a particular polycrystalline microstructure. Optionally, the amorphous carbon is a hydrogenated amorphous carbon. Optionally, the amorphous carbon may include essentially 100% carbon. Optionally, the amorphous carbon may include up to approximately 50% C—H bonded hydrogen. Optionally, the amorphous carbon may include approximately 0.1% to approximately 50% C—H bonded hydrogen, e.g., approximately 0.1% to approximately 1%, approximately 1% to approximately 5%, approximately 5% to approximately 10%, approximately 10% to approximately 20%, approximately 20% to approximately 30%, approximately 30% to approximately 40%, and approximately 40% to approximately 50%. Optionally, the amorphous carbon is a diamond-like hydrogenated amorphous carbon. Optionally, the amorphous carbon is a polymer-like hydrogenated amorphous carbon. Optionally, the amorphous carbon is a graphite-like hydrogenated amorphous carbon. Optionally, the amorphous carbon is doped with a dopant (e.g., nitrogen or boron). Optionally, the amorphous carbon is a derivatized amorphous carbon. Optionally, amorphous carbon material may be fabricated by, for example, physical vapor deposition, chemical vapor deposition, plasma enhanced chemical vapor deposition, magnetron sputtering, ion beam assisted deposition, direct ion beam deposition, ion sputtering, cathodic arc deposition, or pulsed laser deposition.

Amorphous carbon materials have found a wide range of applications in mechanical engineering and medical engineering. For example, amorphous carbon materials have been used in bearings, seals, cutting tools (e.g., Gillette's MACH3 razor). Due to their excellent biocompatibility, amorphous carbon materials have been used in medical devices such as implants. The possibility of using amorphous carbon materials for making electrodes in semiconductor apparatus is explored in the present disclosure for the first time. It was surprisingly discovered in the present disclosure that they exhibit outstanding characteristics as electrode materials such as excellent ohmic contact with semiconductor components of a thin film transistor. The present disclosure thus provides a cost-effective solution to semiconductor manufacturing with good industrial processability.

Any appropriate fabricating methods may be used to make the first electrode S and the second electrode D. For example, an amorphous carbon material may be deposited on the base substrate; and patterned (e.g., by lithography such as a wet etching process) to form the first electrode S and the second electrode D. Examples of appropriate amorphous carbon deposition methods include, but are not limited to, physical vapor deposition, chemical vapor deposition, plasma enhanced chemical vapor deposition, magnetron sputtering, ion beam assisted deposition, direct ion beam deposition, ion sputtering, cathodic arc deposition, or pulsed laser deposition. Examples of appropriate amorphous materials include, but are not limited to, a hydrogenated amorphous material, a diamond-like amorphous carbon material, a polymer-like amorphous carbon material, a graphite-like amorphous carbon material, a polymer-like hydrogenated amorphous carbon, a diamond-like hydrogenated amorphous carbon, a graphite-like hydrogenated amorphous carbon, or any combination thereof. Optionally, the first electrode S and the second electrode D have a thickness in the range of approximately 200 nm to approximately 500 nm, e.g., approximately 200 nm to approximately 300 nm, approximately 300 nm to approximately 400 nm, and approximately 400 nm to approximately 500 nm.

In some embodiments, the active layer AL is made of a material including $M1O_aN_b$, wherein M1 is a single metal or a combination of metals (e.g., as metal alloys or laminates), N stands for nitrogen element, O stands for oxygen element, a>0, and b≥0, e.g., the active layer is made of a metal oxide material or a metal oxynitride material. For example, the active layer may be made of indium gallium zinc oxide, indium gallium tin oxide, or indium tin zinc oxide. Examples of appropriate metal oxide active layer materials include, but are not limited to, indium gallium zinc oxide, zinc oxide, indium gallium tin oxide, indium tin zinc oxide, gallium oxide, indium oxide, HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:$N_b$, and Cd—Sn—O. Examples of appropriate metal oxynitride active layer materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the active layer is made of a material including $M1O_aN_b$ doped with one or more metal element. Optionally, the active layer is made of a material including $M1O_aN_b$ doped with one or more non-metal element. Optionally, the active layer is made of a material including $M1O_aN_b$ doped with one or more metal element and one or more non-metal element.

In some embodiments, the active layer AL is made of a polycrystalline silicon material.

Any appropriate fabricating methods may be used to make the active layer AL. For example, an active layer material may be deposited on the base substrate (e.g., by sputtering or vapor deposition); and patterned (e.g., by lithography such as a wet etching process) to form the active layer AL. Optionally, the active layer has a thickness in the range of approximately 40 nm to approximately 50 nm.

Optionally, the first electrode S is in contact with and on a side of the first electrode contact region SCR distal to the base substrate. Optionally, the second electrode D is in contact with and on a side of the second electrode contact region DCR distal to the base substrate. Optionally, the first electrode S is on a side of the first electrode contact region SCR, and the thin film transistor further includes an ohmic contact layer between the first electrode S and the first electrode contact region SCR. Optionally, the second electrode D is on a side of the second electrode contact region DCR, and the thin film transistor further includes an ohmic contact layer between the second electrode D and the second electrode contact region DCR.

In some embodiments, the thin film transistor is a bottom gate type thin film transistor. In some embodiments, the thin film transistor is a top gate type thin film transistor. As shown in FIG. 1, the top gate type thin film transistor further includes a gate insulating layer GI on a side of the active layer AL (e.g., the channel region CR of the active layer AL) distal to the base substrate BS, and a gate electrode layer G on a side of the gate insulating layer G distal to the active layer AL (e.g., the channel region CR of the active layer AL).

Any appropriate gate electrode materials and any appropriate fabricating methods may be used to make the gate electrode layer G. For example, a gate electrode material may be deposited on the base substrate (e.g., by sputtering or vapor deposition); and patterned (e.g., by lithography such as a wet etching process) to form the gate electrode layer G. Examples of appropriate gate electrode materials include, but are not limited to, molybdenum, aluminum, copper, chromium, tungsten, titanium, tantalum, and alloys or laminates containing the same. Optionally, the gate electrode layer may have a single-layer structure or a stacked-layer structure including two or more sub-layers. Optionally, the gate electrode layer has a thickness in the range of approximately 150 nm to approximately 300 nm, e.g., approximately 200 nm to approximately 300 am.

Any appropriate gate insulating materials and any appropriate fabricating methods may be used to make the gate insulating layer GI. For example, a gate insulating material may be deposited on the base substrate by a plasma-enhanced chemical vapor deposition (PECVD) process. Examples of appropriate gate insulating materials include, but are not limited to, silicon oxide ($SiO_y$), silicon nitride ($SiN_y$, e.g., $SiN_4$), silicon oxynitride ($SiO_xN_y$). Optionally, the gate insulating layer GI may have a single-layer structure or a stacked-layer structure including two or more sub-layers (e.g., a stacked-layer structure including two or more of a silicon oxide sublayer, a silicon nitride sublayer, and a silicon oxynitride sublayer). Optionally, the gate insulating layer GI has a thickness in the range of approximately 80 nm to approximately 300 nm, e.g., approximately 80 nm to approximately 150 nm, approximately 100 nm to approximately 200 nm, and approximately 200 nm to approximately 300 nm.

In some embodiments, the thin film transistor further includes a light shielding layer for shielding the channel region of the active layer from light. As shown in FIG. 1, the thin film transistor in the embodiment further includes a buffer layer BL on a side of the active layer AL proximal to the base substrate BS, and a light shielding layer SL on a side of the buffer layer BL distal to the active layer AL (e.g., the channel region CR of the active layer AL) in an area corresponding to the gate electrode layer G for shielding the channel region CR from light, e.g., shielding the channel region CR from light emitted from a backlight.

Any appropriate light shielding materials and any appropriate fabricating methods may be used to make the light shielding layer SL. For example, a light shielding material may be deposited on the base substrate (e.g., by sputtering or vapor deposition); and patterned (e.g., by lithography such as a wet etching process) to form the light shielding layer SL. Examples of appropriate light shielding materials include, but are not limited to, molybdenum, aluminum, copper, chromium, tungsten, titanium, tantalum, and alloys or laminates containing the same. Optionally, the light shielding layer has a thickness in the range of approximately 200 nm to approximately 300 nm.

Any appropriate buffer layer materials and any appropriate fabricating methods may be used to make the buffer layer BL. For example, a buffer layer material may be deposited on the base substrate by a plasma-enhanced chemical vapor deposition (PECVD) process. Examples of appropriate buffer layer materials include, but are not limited to, silicon oxide ($SiO_y$), silicon nitride ($SiN_y$, e.g., $Si_3N_4$), silicon oxynitride ($SiO_xN_y$). Optionally, the buffer layer BL may have a single-layer structure or a stacked-layer structure including two or more sub-layers (e.g., a stacked-layer structure including two or more of a silicon oxide sublayer, a silicon nitride sublayer, and a silicon oxynitride sublayer). Optionally, the buffer layer BL has a thickness in the range of approximately 200 nm to approximately 300 nm.

Figure 2:
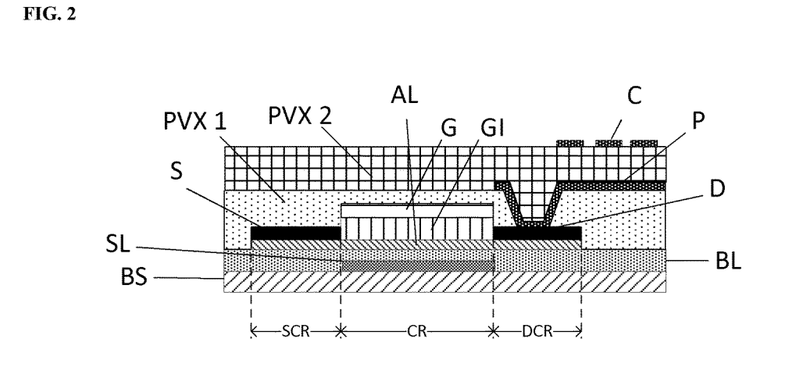
FIG. 2 is a diagram illustrating the structure of a thin film transistor in some embodiments.

In some embodiments, the thin film transistor further includes a first passivation layer on a side of the gate insulating layer distal to the base substrate. As shown in FIG. 1, the first passivation layer PVX1 is on a side of the gate electrode layer G distal to the gate insulating layer GI in the channel region CR, and is on a side of the gate insulating layer GI distal to the first electrode S and the second electrode D in the first electrode contact region SCR and the second electrode contact region DCR. FIG. 2 is a diagram illustrating the structure of a thin film transistor in some embodiments. Referring to FIG. 2, the first passivation layer PVX1 is on a side of the gate electrode layer G distal to the gate insulating layer GI in the channel region CR, on a side of the first electrode S distal to the active layer AL in the first electrode contact region SCR, and on a side of the second electrode D distal to the active layer AL in the second electrode contact region DCR.

In some embodiments, the thin film transistor further includes a pixel electrode layer on a side of the first passivation layer distal to the base substrate. Referring to FIG. 1, the thin film transistor in the embodiment includes a pixel electrode layer P on a side of the first passivation layer PVX1 distal to the gate insulating layer GI. The thin film transistor further includes a via extending through the first passivation layer PVX1 and the gate insulating layer GI, the pixel electrode layer P is electrically connected to the second electrode D (e.g., a drain electrode) of the thin film transistor through the via. Referring to FIG. 2, the thin film transistor in the embodiment includes a pixel electrode layer P on a side of the first passivation layer PVX1 distal to the buffer layer BL. The thin film transistor further includes a via extending through the first passivation layer PVX1, the pixel electrode layer P is electrically connected to the second electrode D (e.g., a drain electrode) of the thin film transistor through the via.

Any appropriate electrode materials and any appropriate fabricating methods may be used to make the pixel electrode layer. For example, a pixel electrode material may be deposited on the base substrate (e.g., by sputtering or vapor deposition); and patterned (e.g., by lithography such as a wet etching process) to form the pixel electrode layer P. Examples of appropriate pixel electrode materials include, but are not limited to, a transparent electrode material such as indium tin oxide, indium zinc oxide, transparent metals (e.g., nano-silver), and a combination thereof.

In some embodiments, the thin film transistor further includes a second passivation layer PVX2 on a side of the first passivation layer PVX1 and the pixel electrode layer P (as shown in FIG. 1 and FIG. 2). In some embodiments, the thin film transistor further includes a common electrode layer C on a side of the second passivation layer PVX2 distal to the first passivation layer PVX1 and the pixel electrode layer P.

Any appropriate passivation layer materials and any appropriate fabricating methods may be used to make the passivation layer PVX1 or PVX2. For example, a passivation layer material may be deposited on the base substrate by a plasma-enhanced chemical vapor deposition (PECVD) process. Examples of appropriate passivation layer materials include, but are not limited to, an inorganic material (e.g., silicon oxide or silicon nitride) or an organic material (e.g., acrylic made by Dow Chemical Co.). Typically, the patterning process includes photoresist application, exposure, developing, etching, photoresist removal, and so on. In some patterning processes, a half-tone mask or a gray tone mask may be utilized.

The amorphous carbon material has relatively high light transmittance. Thus, in a thin film transistor having a first electrode and a second electrode made of an amorphous carbon material, the first electrode and the second electrode areas are transparent. By having the first electrode and the second electrode made of an amorphous carbon material, the aperture ratio of a display panel having the present thin film transistor may be significantly improved. Moreover, etching conditions for etching the amorphous carbon material is highly specific to the amorphous carbon material, i.e., the etchant for etching the amorphous carbon material may not etch or damage other components of the thin film transistor, e.g., the active layer, the gate electrode layer, the gate insulating layer. The present thin film transistor may be fabricated in a much simplified process with a reduced number of patterning steps, leading to lower manufacturing costs. Further, because the etching condition is highly specific, the present thin film transistor does not require an etch stop layer on top of the channel region of the active layer. In addition, the amorphous carbon material has hydrogen absorbing ability. By having the first electrode and the second electrode made of an amorphous carbon material, free hydrogens proximal to the first electrode and the second electrode may be absorbed by the amorphous carbon material in the first electrode and the second electrode, thereby improving reliability of the thin film transistor.

In another aspect, the present disclosure provides a method of fabricating a thin film transistor. In some embodiments, the method includes forming an active layer on a base substrate having a channel region, a first electrode contact region, and a second electrode contact region; forming a first electrode on a side of the first electrode contact region distal to the base substrate; and forming a second electrode on a side of the second electrode contact region distal to the base substrate; the first electrode and the second electrode being made of an amorphous carbon material. Optionally, the active layer, the first electrode, and the second electrode are formed in a single process. Optionally, the active layer being made of a semiconductor material including $M1O_aN_b$, wherein M1 is a single metal or a combination of metals, a>0, and b≥0.

In some embodiments, the step of forming the active layer, the step of forming the first electrode, and the step of forming the second electrode include sequentially forming a semiconductor material layer and an amorphous carbon material layer on the base substrate; patterning the semiconductor material layer to form the active layer; and patterning the amorphous carbon material layer to form the first electrode and the second electrode. Optionally, the semiconductor material layer and the amorphous carbon material layer are formed by depositing a semiconductor material on the base substrate to form a semiconductor material layer; and depositing an amorphous carbon material on the semiconductor material layer to form the amorphous carbon material layer on a side of the semiconductor material layer distal to the base substrate. Optionally, the semiconductor material including $M1O_aN_b$. M1 is a single metal or a combination of metals (e.g., as metal alloys or laminates), N stands for nitrogen element, O stands for oxygen element, a>0, and b≥0. Optionally, the active layer may be made of indium gallium zinc oxide, indium gallium tin oxide, or indium tin zinc oxide.

In some embodiments, the semiconductor material may be deposited on the base substrate using a vapor deposition process, e.g., a PECVD deposition process. When the active layer is made of a metal oxide or metal oxynitride material, the deposition process may be optionally performed in an atmosphere having oxygen. Optionally, the semiconductor material is deposited on the base substrate using a vapor deposition process in an atmosphere containing oxygen in a range of approximately 15% to approximately 30% by volume.

Optionally, the amorphous carbon material is deposited on the base substrate by a magnetron sputtering process. Optionally, the amorphous carbon material is deposited on the base substrate by PECVD deposition process.

In some embodiments, the active layer, the first electrode, and the second electrode are formed by patterning the semiconductor material layer and the amorphous carbon material layer in a single process, e.g., using a single mask plate. For example, the method in some embodiments includes depositing a semiconductor material on the base substrate to form the semiconductor material layer; depositing an amorphous carbon material on the semiconductor material layer to form the amorphous carbon material layer on a side of the semiconductor material layer distal to the base substrate; forming a photoresist layer on a side of the amorphous carbon material layer distal to the semiconductor material layer; exposing the photoresist layer with a half-tone mask plate or a gray-tone mask plate, and developing the exposed photoresist layer to obtain a photoresist pattern having a first section corresponding to the channel region, a second section corresponding to the first electrode contact region and the second electrode contact region, and a third section outside of the first section and the second section, the first section being partially exposed, the second section being substantially unexposed, the third section being fully exposed, and the photoresist material being removed in the third section; removing the semiconductor material layer and the amorphous carbon material layer in the third section, thereby forming the active layer; removing the photoresist layer in the first section while maintaining the photoresist layer in the second section, thereby exposing the amorphous carbon material layer in the first section; and removing the amorphous carbon material layer in the first section, thereby forming the first electrode and the second electrode. Optionally, the photoresist layer in the first section is removed by ashing. Optionally, the semiconductor material including $M1O_aN_b$.

In some embodiments, the amorphous carbon material layer may be etched using a dry etching process. Optionally, the dry etching process is performed by dry etching using oxygen plasma or UV ozone. For example, the etching of the amorphous carbon material layer may be achieved by adjusting the flow of oxygen or ozone. Because a dry etching condition using oxygen or ozone is highly specific for etching the amorphous carbon material layer, the gate insulating layer and the gate electrode layer are not damaged or etched during the dry etching process of the amorphous carbon material layer. Accordingly, the amorphous carbon material layer in the first section and the third section may be removed by dry etching using oxygen or ozone.

Optionally, the gate insulating layer is etched using a dry etching process. Optionally, the dry etching process is performed by dry etching using tetrafluoromethane.

In some embodiments, subsequent to the step of forming the active layer, the first electrode, and the second electrode, the method further includes annealing the active layer. By annealing the active layer, the active layer material (e.g., metal oxide or metal oxynitride) may be stabilized and the resistance thereof may be lowered, thereby enhancing the electronic properties of the thin film transistor. Optionally, the active layer is annealed at an annealing temperature in the range of approximately 230 degrees to approximately 400 degrees. Optionally, the active layer is annealed for an annealing duration of at least 10 minutes.

Optionally, the method further includes forming a gate insulating layer on a side of the channel region distal to the base substrate; and forming a gate electrode layer on a side of the gate insulating layer distal to the channel region.

Optionally, prior to forming the active layer, the first electrode, and the second electrode, the method further includes forming a buffer layer on a side of the active layer proximal to the base substrate; and forming a light shielding layer on a side of the buffer layer distal to the channel region in an area corresponding to the channel region for shielding the channel region from light.

Optionally, subsequent to the step of forming the gate insulating layer, the method further includes forming a first passivation layer on a side of the gate electrode layer distal to the base substrate.

Optionally, the method further includes forming a pixel electrode layer on a side of the first passivation layer distal to the base substrate.

Optionally, the method further includes forming a second passivation layer on a side of the pixel electrode layer distal to the base substrate, e.g., on a side of the first passivation layer and the pixel electrode layer distal to the base substrate.

Optionally, the method further includes forming a common electrode layer on a side of the second passivation layer distal to the base substrate, e.g., on a side of the second passivation layer distal to the first passivation layer and the pixel electrode layer.

Figure 3A:
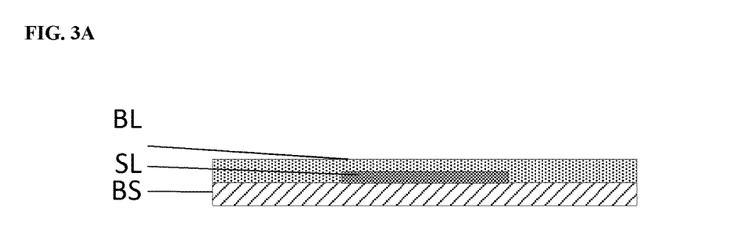
FIG. 3A-3J illustrates a process of fabricating a thin film transistor in some embodiments.

FIG. 3A-3J illustrates a process of fabricating a thin film transistor in some embodiments. Referring to FIG. 3A, the fabricating method includes forming a light shielding layer SL on the base substrate BS, and forming a buffer layer BL on a side of the light shielding layer SL distal to the base substrate BS.

Figure 3B:
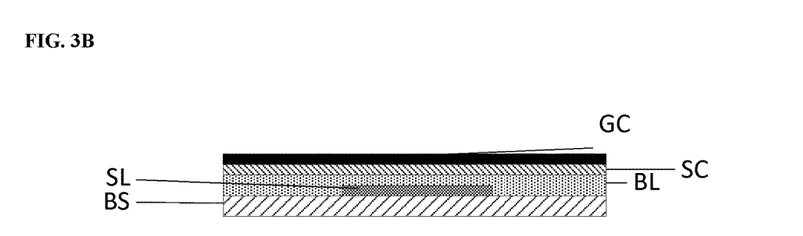

Referring to FIG. 38, the method in the embodiment further includes sequentially forming a semiconductor material layer SC on a side of the buffer layer BL distal to the base substrate BS, followed by forming an amorphous carbon material layer GC on a side of the semiconductor material layer SC distal to the buffer layer BL.

Figure 3C:
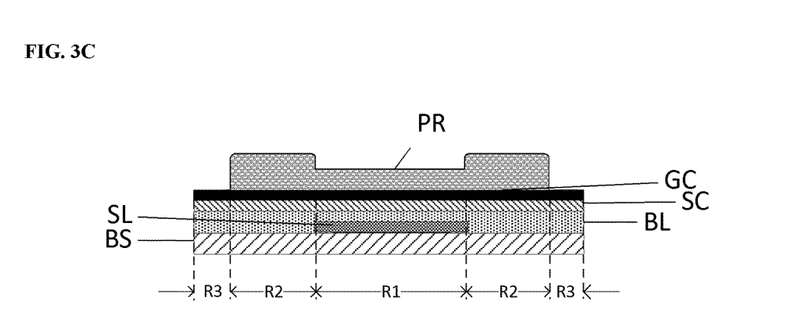

Referring to FIG. 3C, the method in the embodiment further includes forming a photoresist layer PR on a side of the amorphous carbon material layer GC distal to the semiconductor material layer SC. The photoresist layer PR is then exposed with a half-tone mask plate or a gray-tone mask plate, and the exposed photoresist layer is developed to obtain a photoresist pattern having a first section R1 corresponding to the channel region, a second section R2 corresponding to the first electrode contact region and the second electrode contact region, and a third section R3 outside of the first section and the second section. The first section R1 is partially exposed, the second section R2 is substantially unexposed. The third section R3 is fully exposed, and the photoresist material is removed in the third section R3.

Figure 3D:
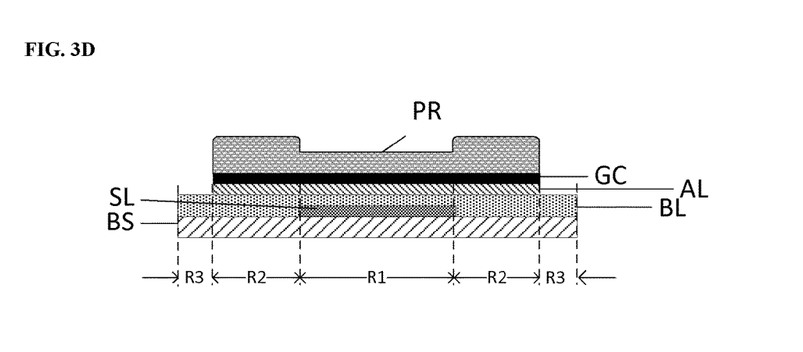
Figure 3E:
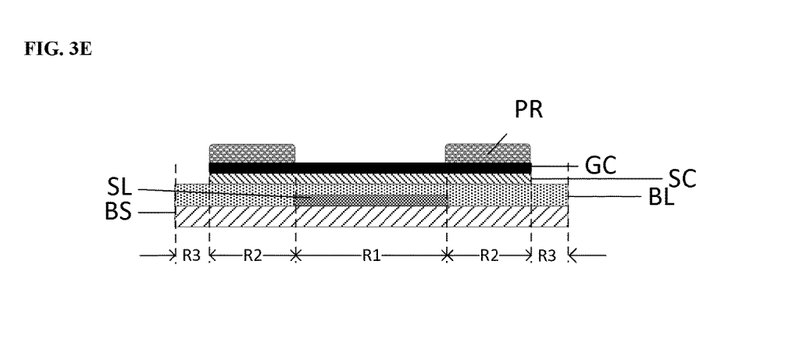

Referring to FIG. 3D, the method in the embodiment further includes removing the semiconductor material layer SC and the amorphous carbon material GC layer in the third section R3, thereby forming the active layer AL. Referring to FIG. 3E, the method in the embodiment further includes removing the photoresist layer PR in the first section R while maintaining the photoresist layer PR in the second section R2 (e.g., by ashing the photoresist layer PR), thereby exposing the amorphous carbon material layer GC in the first section R1

Figure 3F:
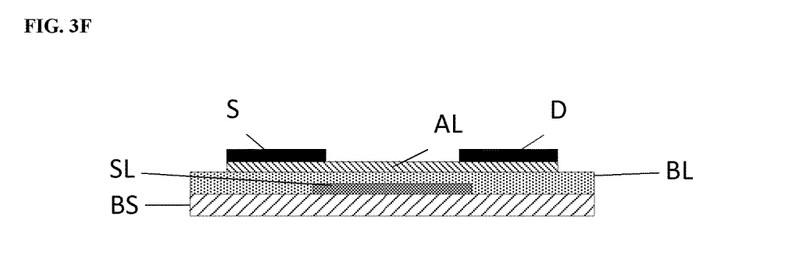

Referring to FIG. 3F, the method in the embodiment further includes removing the amorphous carbon material layer GC in the first section, thereby forming the first electrode S and the second electrode D. Subsequently, the remaining photoresist layer PR in the second section may be removed.

Figure 3G:
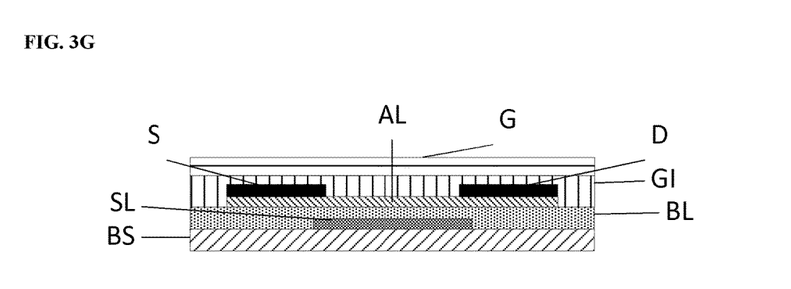

Referring to FIG. 3G, the method in the embodiment further includes forming a gate insulating layer GI on a side of the active layer AL, the first electrode S, and the second electrode D distal to the buffer layer BL, and a gate electrode material layer G on a side of the gate insulating layer distal to the active layer AL, the first electrode S and the second electrode D, and patterning the gate electrode material layer G to form a gate electrode layer on a side of the gate insulating layer GI distal to the active layer AL (e.g., the channel region of the active layer AL).

Figure 3H:
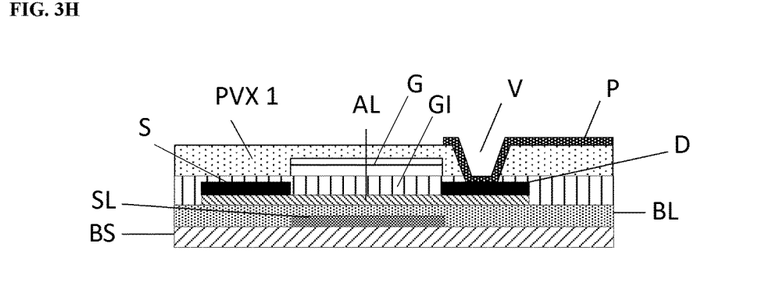

Referring to FIG. 3H, the method in the embodiment further includes forming a first passivation layer PVX1 on a side of the gate electrode layer G distal to the gate insulating layer GI in the channel region, on a side of the gate insulating layer GI distal to the first electrode S in the first electrode contact region, and on a side of the gate insulating layer GI distal to the second electrode D in the second electrode contact region. The method further includes forming a via V extending through the first passivation layer PVX1 and the gate insulating layer GI, exposing a portion of the second electrode D. and forming a pixel electrode layer P on a side of the first passivation layer PVX1 distal to the gate insulating layer GI, the pixel electrode layer P electrically connected to the second electrode D (e.g., a drain electrode) through the via V.

Figure 3I:
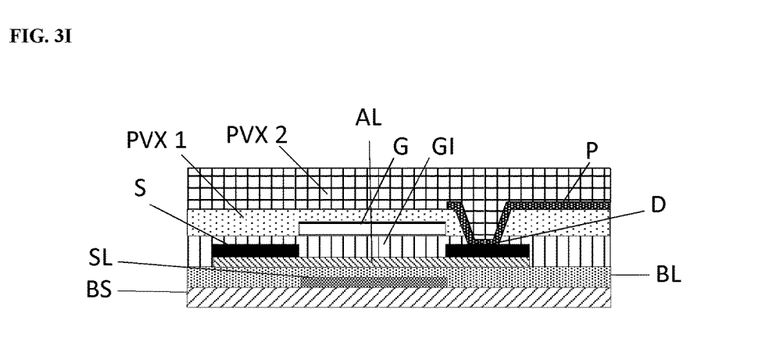
Figure 3J:
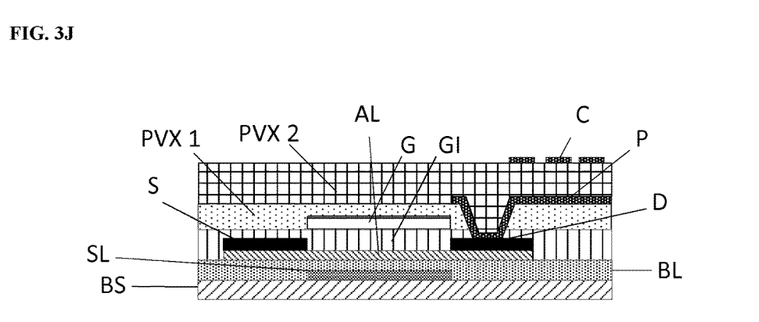

Referring to FIG. 3I, the method in the embodiment further includes forming a second passivation layer PVX2 on a side of the pixel electrode layer P distal to the first passivation layer PVX1. Referring to FIG. 3J, the method in the embodiment further includes forming a common electrode layer C on a side of the second passivation layer PVX2 distal to the first passivation layer PVX1.

By having the first electrode and the second electrode made of an amorphous carbon material, the aperture ratio of a display panel having the present thin film transistor may be significantly improved. Moreover, etching conditions for etching the amorphous carbon material is highly specific to the amorphous carbon material, i.e., the etchant for etching the amorphous carbon material may not etch or damage other components of the thin film transistor, e.g., the active layer, the gate electrode layer, the gate insulating layer. The present thin film transistor may be fabricated in a much simplified process with a reduced number of patterning steps, leading to lower manufacturing costs. Further, because the etching condition is highly specific, the present thin film transistor does not require an etch stop layer on top of the channel region of the active layer. In addition, the amorphous carbon material has hydrogen absorbing ability. By having the first electrode and the second electrode made of an amorphous carbon material, free hydrogens proximal to the first electrode and the second electrode may be absorbed by the amorphous carbon material in the first electrode and the second electrode, thereby improving reliability of the thin film transistor.

In another aspect, the present disclosure provides a display substrate having a thin film transistor described herein or fabricated by a method described herein. In another aspect, the present disclosure further provides a display panel having a display substrate described herein. In another aspect, the present disclosure further provides a display apparatus having a display panel described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. A thin film transistor, comprising:
a base substrate;
an active layer on the base substrate comprising a channel region, a first electrode contact region, and a second electrode contact region; and
a first electrode on a side of the first electrode contact region distal to the base substrate; and a second electrode on a side of the second electrode contact region distal to the base substrate; the first electrode and the second electrode being made of an amorphous carbon material;
wherein the amorphous carbon material comprises a hydrogenated amorphous carbon material.
2. The thin film transistor of claim 1, further comprising:
a gate insulating layer on a side of the channel region distal to the base substrate; and
a gate electrode layer on a side of the gate insulating layer distal to the channel region.
3. The thin film transistor of claim 2, further comprising:
a buffer layer on a side of the active layer proximal to the base substrate; and
a light shielding layer on a side of the buffer layer distal to the channel region in an area corresponding to the channel region for shielding the channel region from light.
4. The thin film transistor of claim 1, wherein the active layer is made of a material comprising $M1O_aN_b$, wherein M1 is a single metal or a combination of metals, $a>0$, and $b>0$.
5. The thin film transistor of claim 4, wherein the active layer is made of indium gallium zinc oxide.
6. The thin film transistor of claim 2, further comprising:
a passivation layer on a side of the gate electrode layer distal to the base substrate; and
a pixel electrode layer on a side of the passivation layer distal to the base substrate.
7. The thin film transistor of claim 1, wherein the active layer has a thickness in a range of approximately 40 nm to approximately 50 nm.
8. The thin film transistor of claim 1, wherein the first electrode and the second electrode have a thickness in a range of approximately 200 nm to approximately 500 nm.
9. A display apparatus, comprising a thin film transistor of claim 1.
10. A method of fabricating a thin film transistor, comprising:
forming an active layer on a base substrate having a channel region, a first electrode contact region, and a second electrode contact region;
forming a first electrode on a side of the first electrode contact region distal to the base substrate; and
forming a second electrode on a side of the second electrode contact region distal to the base substrate; the first electrode and the second electrode being made of an amorphous carbon material;
wherein the step of forming the active layer, the step of forming the first electrode, and the step of forming the second electrode comprise:
sequentially forming a semiconductor material layer and an amorphous carbon material layer on the base substrate;
patterning the semiconductor material layer to form the active layer; and
patterning the amorphous carbon material layer to form the first electrode and the second electrode.
11. The method of claim 10, wherein the active layer, the first electrode, and the second electrode are formed by patterning the semiconductor material layer and the amorphous carbon material layer using a single mask plate.
12. The method of claim 10, wherein the semiconductor material layer and the amorphous carbon material layer are formed by depositing a semiconductor material on the base substrate to form a semiconductor material layer; and depositing an amorphous carbon material on the semiconductor material layer to form the amorphous carbon material layer on a side of the semiconductor material layer distal to the base substrate.
13. The method of claim 10, wherein the semiconductor material comprises indium gallium tin oxide, and is deposited on the base substrate using a vapor deposition process in an atmosphere comprising oxygen in a range of approximately 15% to approximately 30% by volume.
14. The method of claim 10, wherein the amorphous carbon material is deposited by a magnetron sputtering process.
15. The method of claim 11, wherein the step of forming the active layer, the first electrode, and the second electrode using a single mask plate comprises:
depositing a semiconductor material on the base substrate to form the semiconductor material layer;
depositing an amorphous carbon material on the semiconductor material layer to form the amorphous carbon material layer on a side of the semiconductor material layer distal to the base substrate;
forming a photoresist layer on a side of the amorphous carbon material layer distal to the semiconductor material layer;
exposing the photoresist layer with a half-tone mask plate or a gray-tone mask plate, and developing the exposed photoresist layer to obtain a photoresist pattern having a first section corresponding to the channel region, a second section corresponding to the first electrode contact region and the second electrode contact region, and a third section outside of the first section and the second section, the first section being partially exposed, the second section being substantially unexposed, the third section being fully exposed, and the photoresist material being removed in the third section;
removing the semiconductor material layer and the amorphous carbon material layer in the third section, thereby forming the active layer;
removing the photoresist layer in the first section while maintaining the photoresist layer in the second section, thereby exposing the amorphous carbon material layer in the first section; and
removing the amorphous carbon material layer in the first section, thereby forming the first electrode and the second electrode.
16. The method of claim 15, wherein the amorphous carbon material layer in the first section and the third section is removed by dry etching using oxygen.
17. The method of claim 15, wherein the photoresist layer in the first section is removed by ashing.
18. The method of claim 10, subsequent to the step of forming the active layer, the first electrode, and the second electrode, further comprising:
annealing the active layer at an annealing temperature in a range of approximately 230 degrees to approximately 400 degrees.

19. The thin film transistor of claim 1, wherein the amorphous carbon comprises approximately 0.1% to approximately 50% C—H bonded hydrogen.

20. The method of claim 10, wherein the amorphous carbon material comprises a hydrogenated amorphous carbon material.

* * * * *